United States Patent
Kameyama et al.

(10) Patent No.: US 9,741,554 B2
(45) Date of Patent: Aug. 22, 2017

(54) METHOD OF MANUFACTURING SEMICONDUCTOR DEVICE

(71) Applicant: TOYOTA JIDOSHA KABUSHIKI KAISHA, Toyota-shi, Aichi-ken (JP)

(72) Inventors: Satoru Kameyama, Toyota (JP); Masaki Ajioka, Miyoshi (JP); Shuhei Oki, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/372,181

(22) Filed: Dec. 7, 2016

(65) Prior Publication Data

US 2017/0170005 A1    Jun. 15, 2017

(30) Foreign Application Priority Data

Dec. 11, 2015  (JP) ................. 2015-242605

(51) Int. Cl.
*H01L 21/02*    (2006.01)
*H01L 29/34*    (2006.01)
*H01L 21/285*   (2006.01)
*H01L 29/66*    (2006.01)

(52) U.S. Cl.
CPC .. *H01L 21/02068* (2013.01); *H01L 21/28556* (2013.01); *H01L 29/34* (2013.01); *H01L 29/66325* (2013.01)

(58) Field of Classification Search
None
See application file for complete search history.

(56) References Cited

U.S. PATENT DOCUMENTS

| | | |
|---|---|---|
| 2008/0076238 A1 | 3/2008 | Miyashita et al. |
| 2010/0227461 A1 | 9/2010 | Ochi |
| 2013/0156948 A1 | 6/2013 | Amano |
| 2013/0260515 A1* | 10/2013 | Mizushima ....... H01L 29/66325 438/135 |

(Continued)

FOREIGN PATENT DOCUMENTS

| | | |
|---|---|---|
| JP | H10-4073 A | 1/1998 |
| JP | 2008-085050 A | 4/2008 |

(Continued)

*Primary Examiner* — Asok K Sarkar
(74) *Attorney, Agent, or Firm* — Oliff PLC (57) ABSTRACT

A method of manufacturing a semiconductor device includes a semiconductor region forming process, a cleaning process, a surface roughness uniformizing process, and an electrode forming process. As the semiconductor region forming process, semiconductor regions are formed such that a plurality of semiconductor regions with different ion injection amounts are exposed on one principal surface of a semiconductor substrate. As the cleaning process, after the semiconductor region forming process, a cleaning using hydrofluoric acid is performed on the one principal surface of the semiconductor substrate. As the surface roughness uniformizing process, after the cleaning process, the surface roughness of the one principal surface of the semiconductor substrate is uniformized. As the electrode forming process, after the surface roughness uniformizing process, electrodes are formed on the one principal surface of the semiconductor substrate.

6 Claims, 4 Drawing Sheets

(56) References Cited

U.S. PATENT DOCUMENTS

2014/0084335 A1* 3/2014 Senoo et al. ........ H01L 29/0834
257/140
2016/0379926 A1* 12/2016 Howard et al. ... H01L 23/53223
257/751

FOREIGN PATENT DOCUMENTS

| JP | 2010-206056 A | 9/2010 |
| JP | 2013-128015 A | 6/2013 |

* cited by examiner

METHOD OF MANUFACTURING SEMICONDUCTOR DEVICE

The disclosure of Japanese Patent Application No. 2015-242605 filed on Dec. 11, 2015 including the specification, drawings and abstract is incorporated herein by reference in its entirety.

BACKGROUND

1. Technical Field

A technique disclosed in this specification relates to a method of manufacturing a semiconductor device.

2. Description of Related Art

In many semiconductor devices, electrodes are formed on one principal surface of a semiconductor substrate. Such electrodes are formed on one principal surface of the semiconductor substrate after one principal surface of the semiconductor substrate is cleaned. Japanese Patent Application Publication No. 2008-085050 (JP 2008-085050 A) discloses a technique which removes a natural oxide film formed on one principal surface of a semiconductor substrate using HF cleaning (cleaning using hydrofluoric acid) and then forms electrodes on one principal surface of the semiconductor substrate.

SUMMARY

As an example of semiconductor devices, a reverse conducting IGBT in which an IGBT region and a diode region are formed in the same semiconductor substrate is known. In a reverse conducting IGBT, a $p^+$-type collector region corresponding to the IGBT region and an $n^+$-type cathode region corresponding to the diode region are patterned on a rear surface of the semiconductor substrate so as to be exposed on the rear surface of the semiconductor substrate, and a rear electrode is formed on the rear surface of the semiconductor substrate so as to cover the collector region and the cathode region. In the collector region and the cathode region, an ion injection amount is adjusted according to desired characteristics. For this reason, typically, the ion injection amount of the collector region does not match the ion injection amount of the cathode region. In this way, if the collector region and the cathode region are formed with different ion injection amounts, since damage to the rear surface of the semiconductor substrate during ion injection varies, the surface roughness of the rear surface of the semiconductor substrate is different between the collector region and the cathode region.

If the rear electrode is formed so as to cover the collector region and the cathode region, the surface roughness of the collector region and the cathode region is reflected in the rear electrode. For this reason, the surface roughness of the front surface of the rear electrode changes corresponding to the patterns of the collector region and the cathode region. For example, in a case where the collector region and the cathode region have a stripe-shaped layout, portions with different surface roughness are formed on the front surface of the rear electrode in a stripe shape. For this reason, stripe-shaped shadows appear on the front surface of the rear electrode due to variation in diffuse reflection of light.

As one inspection item for semiconductor devices, an appearance inspection for detecting flaws formed on the front surface of the electrode is performed. In a case of the reverse conducting IGBT described above, since shadows appear on the front surface of the rear electrode corresponding to the patterns of the collector region and the cathode region, it is difficult to distinguish between such shadows and flaws.

In the above description, a problem that portions having different surface roughness are formed on the rear electrode of the semiconductor substrate has been described in connection with the reverse conducting IGBT as an example. However, such a problem is not limited to the reverse conducting IGBT, and may occur in various semiconductor devices in which semiconductor regions with different ion injection amounts are formed on one principal surface of a semiconductor substrate. This specification provides a technique which, in a semiconductor substrate in which a plurality of semiconductor regions with different ion injection amounts are exposed on one principal surface, prevents variation in surface roughness between the semiconductor regions on one principal surface of the semiconductor substrate from being reflected in the electrode.

A method of manufacturing a semiconductor device disclosed in this specification includes a semiconductor region forming process, a cleaning process, a surface roughness uniformizing process, and an electrode forming process. As the semiconductor region forming process, semiconductor regions are formed such that a plurality of semiconductor regions with different ion injection amounts are exposed on one principal surface of a semiconductor substrate. As the cleaning process, after the semiconductor region forming process, a cleaning using hydrofluoric acid is performed on the one principal surface of the semiconductor substrate. As the surface roughness uniformizing process, after the cleaning process, the surface roughness of the one principal surface of the semiconductor substrate is uniformized. As the electrode forming process, after the surface roughness uniformizing process, electrodes are formed on the one principal surface of the semiconductor substrate.

According to the above-described manufacturing method, the surface roughness of one principal surface of the semiconductor substrate is uniformized prior to the electrode forming step, whereby variation in surface roughness on one principal surface of the semiconductor substrate is prevented from being reflected in the electrode.

BRIEF DESCRIPTION OF THE DRAWINGS

Features, advantages, and technical and industrial significance of exemplary embodiments of the present disclosure will be described below with reference to the accompanying drawings, in which like numerals denote like elements, and wherein.

DETAILED DESCRIPTION OF EMBODIMENTS

Figure 1:
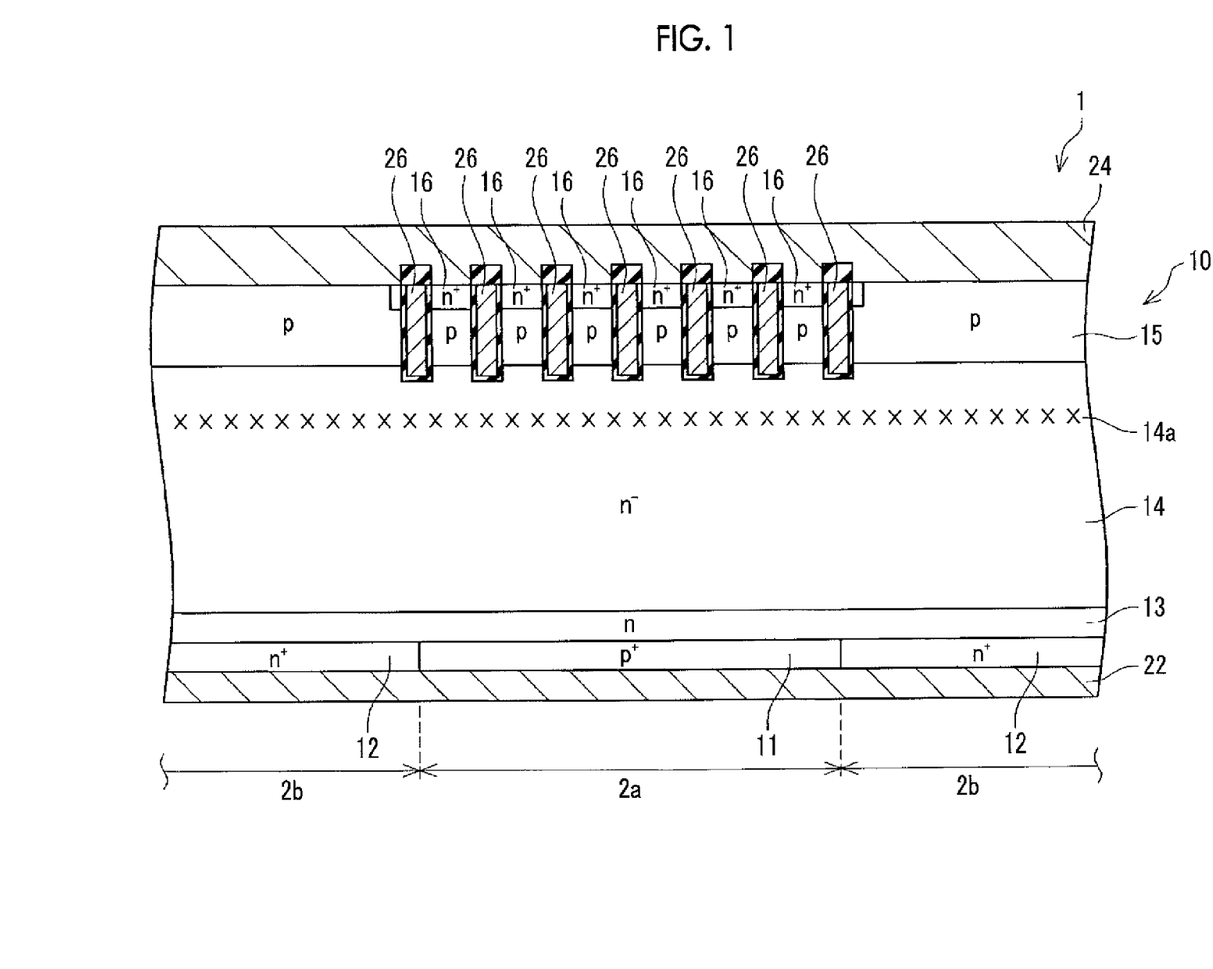
FIG. 1 is a sectional view schematically showing a main part of a reverse conducting IGBT.

As shown in FIG. 1, a reverse conducting IGBT 1 includes a silicon single crystal semiconductor substrate 10 which is divided into an IGBT region 2a and a diode region 2b, a rear electrode 22 which covers the rear surface of the semiconductor substrate 10, a front electrode 24 which covers the front surface of the semiconductor substrate 10, and trench gates 26 which are provided on the front surface side of the IGBT region 2a of the semiconductor substrate 10. The rear electrode 22 functions as a collector electrode in the IGBT region 2a, and functions as a cathode electrode in the diode region 2b. The front electrode 24 functions as an emitter electrode in the IGBT region 2a, and functions as an anode electrode in the diode region 2b. In an example, aluminum silicon (AlSi) is used as the material of the rear electrode 22, and aluminum silicon (AlSi) is used as the material of the front electrode 24.

The semiconductor substrate 10 has a p$^+$-type collector region 11, an n$^+$-type cathode region 12, an n$^+$-type buffer region 13, an n$^-$-type drift region 14, a p-type region 15, and an n$^+$-type emitter region 16.

The collector region 11 is provided on a part of the rear surface of the semiconductor substrate 10, and is exposed on the rear surface of the semiconductor substrate 10. The collector region 11 is provided on a part below the drift region 14, and is selectively disposed in the IGBT region 2a. In the semiconductor substrate 10, a range in which the collector region 11 exists is referred to as the IGBT region 2a. The collector region 11 has a high impurity concentration, and is into ohmic-contact with the rear electrode 22. The collector region 11 is formed by introducing boron from the rear surface of the semiconductor substrate 10, for example, using an ion injection method.

The cathode region 12 is provided on a part of the rear surface of the semiconductor substrate 10, and is exposed on the rear surface of the semiconductor substrate 10. The cathode region 12 is provided on a part below the drift region 14, and is selectively disposed in the diode region 2b. In the semiconductor substrate 10, a range in which the cathode region 12 exists is referred to as the diode region 2b. The cathode region 12 has a high impurity concentration, and is into ohmic-contact with the rear electrode 22. The cathode region 12 is formed by introducing phosphorous from the rear surface of the semiconductor substrate 10, for example, using an ion injection method.

The buffer region 13 is provided between the collector region 11 and the drift region 14 and between the cathode region 12 and the drift region 14, and is continuously disposed over both of the IGBT region 2a and the diode region 2b. The buffer region 13 is formed by introducing phosphorous from the rear surface of the semiconductor substrate 10, for example, using an ion injection method.

The drift region 14 is provided between the buffer region 13 and the p-type region 15, and is continuously disposed over both of the IGBT region 2a and the diode region 2b The drift region 14 is a remaining portion where other regions are formed in the semiconductor substrate 10, and has a uniform impurity concentration in a thickness direction. In an upper layer portion of the drift region 14, a lifetime control region 14a with crystal defects adjusted with a high density through He irradiation is formed.

The p-type region 15 is provided above the drift region 14, is into contact with the drift region 14, is continuously disposed over both of the IGBT region 2a and the diode region 2b, and is exposed on the front surface of the semiconductor substrate 10. The p-type region 15 functions as a body region in the IGBT region 2a, and functions as an anode region in the diode region 2b. The p-type region 15 is into ohmic-contact with the front electrode 24 through a contact region (not shown) in the IGBT region 2a, and is also into ohmic-contact with the front electrode 24 in the diode region. The p-type region 15 is formed by introducing boron from the front surface of the semiconductor substrate 10, for example, using an ion injection technique.

The emitter region 16 is provided above the p-type region 15, is into contact with the p-type region 15, is selectively disposed in the IGBT region 2a, is into contact with the sides of the trench gate 26, and is exposed on the front surface of the semiconductor substrate 10. The emitter region 16 has a high impurity concentration, and is into ohmic-contact with the front electrode 24. The emitter region 16 is formed by introducing phosphorous from the front surface of the semiconductor substrate 10, for example, using an ion injection technique.

Each of the trench gates 26 has an electrode portion made of polysilicon and an insulating film made of silicon oxide, and the electrode portion faces the semiconductor substrate 10 through the insulating film. The electrode portion of each of the trench gates 26 is separated from the front electrode 24 though an interlayer insulating film, and is configured such that a gate potential is applicable thereto. Each of the trench gates 26 is configured to extend from the front surface of the semiconductor substrate 10 toward a deep portion, to pass through the p-type region 15, and to protrude to the drift region 14.

In the reverse conducting IGBT 1, the rear electrode 22, the collector region 11, the buffer region 13, the drift region 14, the p-type region 15, the emitter region 16, the front electrode 24, and the trench gates 26 constitute an IGBT structure. In the reverse conducting IGBT 1, the rear electrode 22, the cathode region 12, the buffer region 13, the drift region 14, the p-type region 15, and the front electrode 24 constitute a diode structure.

In the reverse conducting IGBT 1, if a voltage which becomes more positive than the front electrode 24 is applied to the rear electrode 22, and a voltage which becomes more positive than the front electrode 24 is applied to the electrode portion of each of the trench gates 26, the IGBT structure of the IGBT region 2a is turned on. In the reverse conducting IGBT 1, if a voltage which becomes more positive than the front electrode 24 is applied to the rear electrode 22, and the same voltage as the front electrode 24 is applied to the electrode portion of each of the trench gates 26, the IGBT structure of the IGBT region 2a is turned off. In the reverse conducting IGBT 1, when a reverse bias which becomes more positive than the rear electrode 22 is applied to the front electrode 24, a reflux current flows through the diode structure of the diode region 2b.

Next, a method of manufacturing the reverse conducting IGBT 1 will be described. Hereinafter, a step of forming a rear surface structure among steps executed in the process for manufacturing the reverse conducting IGBT 1 will be described. As the steps of forming other constituent elements can be executed using existing manufacturing techniques, description thereof will be omitted. Hereinafter, the respective steps of forming the rear surface structure will be described based on FIGS. 3A to 3E while referring to the manufacturing flow of FIG. 2.

Figure 3A:
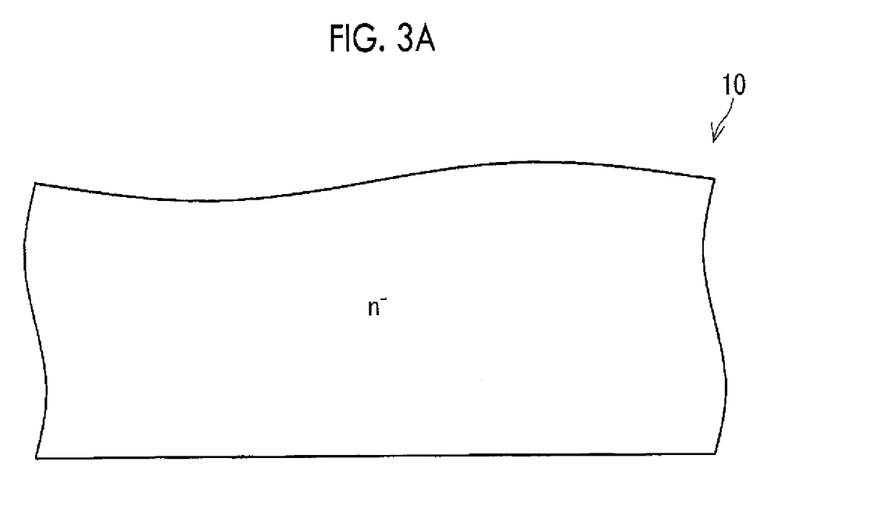
FIG. 3A is an enlarged sectional view schematically showing a main part of the, reverse conducting IGBT in the step of forming the rear structure.

First, as shown in FIG. 3A, the semiconductor substrate 10 is prepared. Various semiconductor regions 15, 16, the front electrode 24, and the trench gates 26 are already formed on the front surface side of the semiconductor substrate 10.

Figure 2:
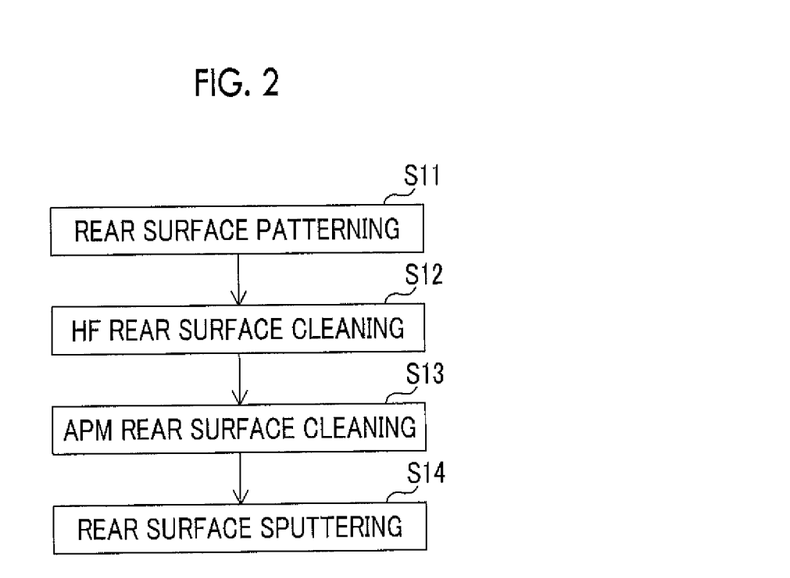
FIG. 2 shows a flow of a step of forming a rear structure in a method of manufacturing a reverse conducting IGBT.
Figure 3B:
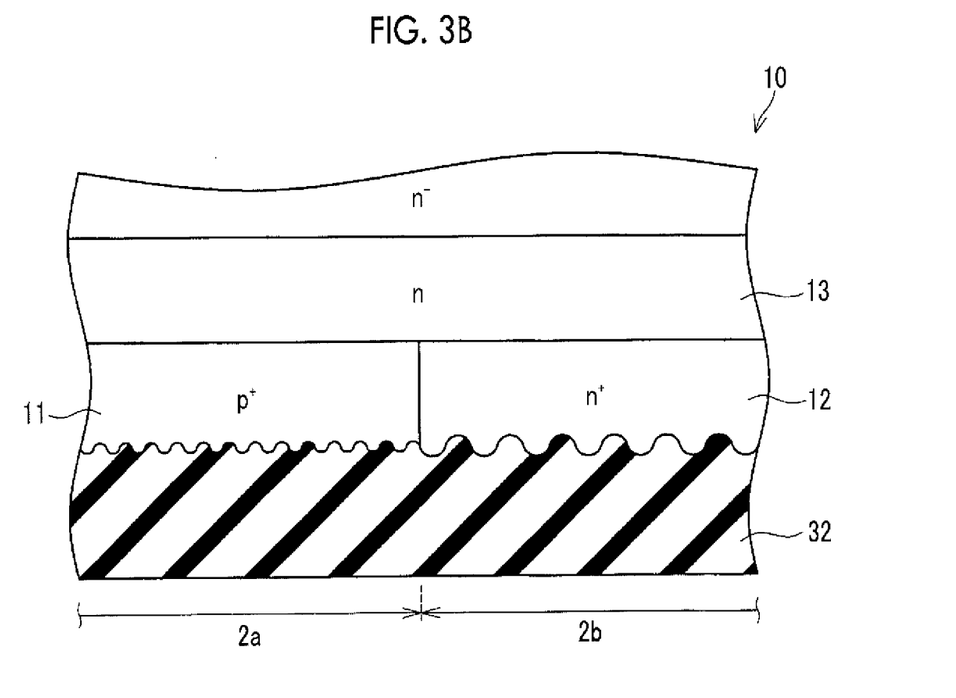
FIG. 3B is an enlarged sectional view schematically showing a main part of the reverse conducting IGBT in the step of forming the rear structure.

Next, as shown in FIG. 3B, the collector region 11, the cathode region 12, and the buffer region 13 are patterned on the rear surface of the semiconductor substrate 10 (S11 of FIG. 2). Specifically, first, the buffer region 13 is formed by introducing phosphorous into the entire rear surface of the semiconductor substrate 10 using an ion injection method. Next, the cathode region 12 is formed by selectively introducing phosphorous into the diode region 2b on the rear surface of the semiconductor substrate 10 using an ion injection method. Next, the collector region 11 is formed by selectively introducing boron into the IGBT region 2a on the rear surface of the semiconductor substrate 10 using an ion injection method. If this rear surface patterning step is executed, a natural oxide film 32 is coated on the rear surface of the semiconductor substrate 10.

The ion injection amount of boron when forming the collector region 11 is, for example, $1 \times 10^{13}$ cm$^{-2}$. The ion injection amount of phosphorous when forming the cathode region 12 is, for example, $1 \times 10^{15}$ cm$^{-2}$. The ion injection amount of the collector region 11 does not match the ion injection amount of the cathode region 12. In this way, if the collector region 11 and the cathode region 12 are formed with different ion injection amounts, since damage to the rear surface of the semiconductor substrate 10 during ion injection is different, the surface roughness of the rear surface of the semiconductor substrate 10 is different between the collector region 11 and the cathode region 12. As shown in FIG. 3B, the surface roughness of the rear surface of the semiconductor substrate 10 corresponding to the collector region 11 is relatively small, and the surface roughness of the rear surface of the semiconductor substrate 10 corresponding to the cathode region 12 is relatively large.

Figure 3C:
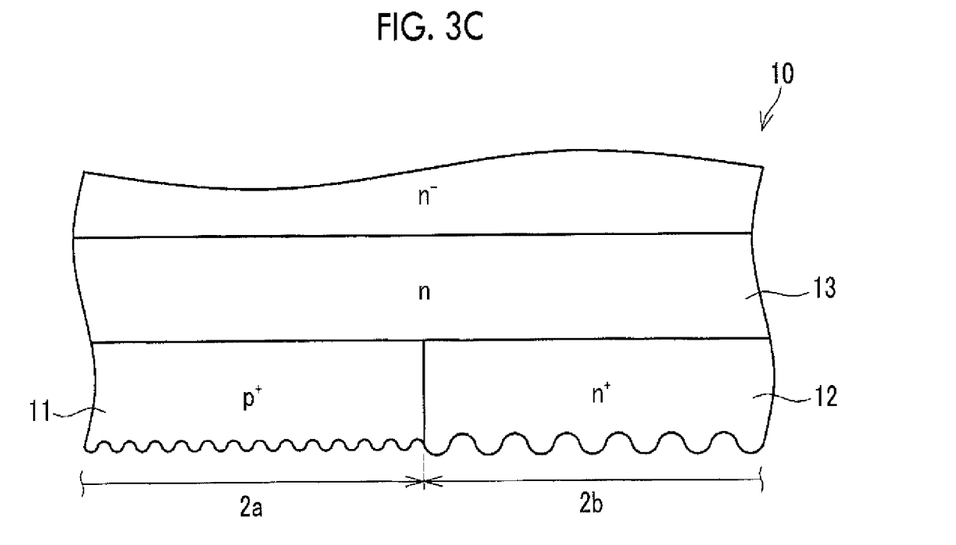
FIG. 3C is an enlarged sectional view schematically showing a main part of the reverse conducting IGBT in the step of forming the rear structure.

Next, as shown in FIG. 3C, HF cleaning (cleaning using fluorinated acid) is performed on the rear surface of the semiconductor substrate 10, and the natural oxide film 32 coated on the rear surface of the semiconductor substrate 10 is removed (S12 of FIG. 2).

Figure 3D:
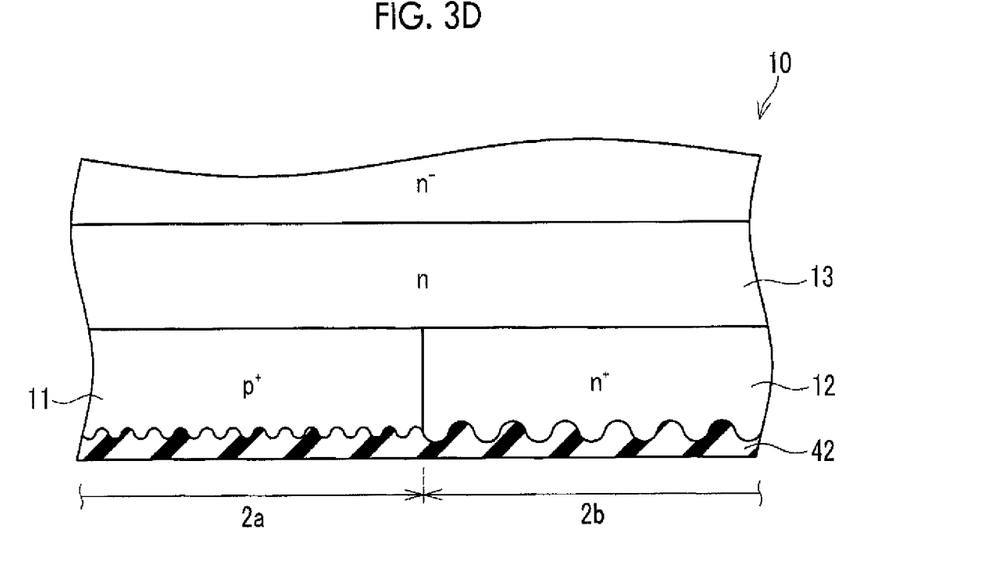
FIG. 3D is an enlarged sectional view schematically showing a main part of the reverse conducting IGBT in the step of forming the rear structure.

Next, as shown in FIG. 3D, APM cleaning (cleaning using a mixture of ammonia and a hydrogen peroxide solution) is performed on the rear surface of the semiconductor substrate 10, a thin oxide film 42 is coated on the rear surface of the semiconductor substrate 10, and the surface roughness of the rear surface of the semiconductor substrate 10 is uniformized (S13 of FIG. 2). The thickness of the oxide film 42 is about 1 to 10 nm. Typically, APM cleaning is performed for the purpose of removing an organic substance. The technique disclosed in this specification, focusses on the oxidization capability of APM cleaning is focused, and the thin oxide film 42 is formed using APM cleaning. Since APM cleaning causes a liquid reaction with the rear surface of the semiconductor substrate 10, it is possible to make oxygen react with the rear surface of the semiconductor substrate 10 uniformly. For this reason, a recessed portion of the uneven rear surface of the semiconductor substrate 10 is filled with the oxide film 42 extending from the sides and bottom thereof in a comparatively short period of time. That is, the oxide film 42 with which the recessed portion is filled is formed at a film thickness larger than the apex of a protruded portion of the uneven rear surface of the semiconductor substrate 10. With this, if APM cleaning is performed on the rear surface of the semiconductor substrate 10, the surface roughness of the rear surface of the semiconductor substrate 10 is reduced by the oxide film 42, and the surface roughness is uniformized. In FIG. 3D, while the front surface of the oxide film 42 is smoothed, it is not important that the front surface of the oxide film 42 is smoothed, but it is important that the surface roughness of the front surface of the oxide film 42 is uniformized.

Figure 3E:
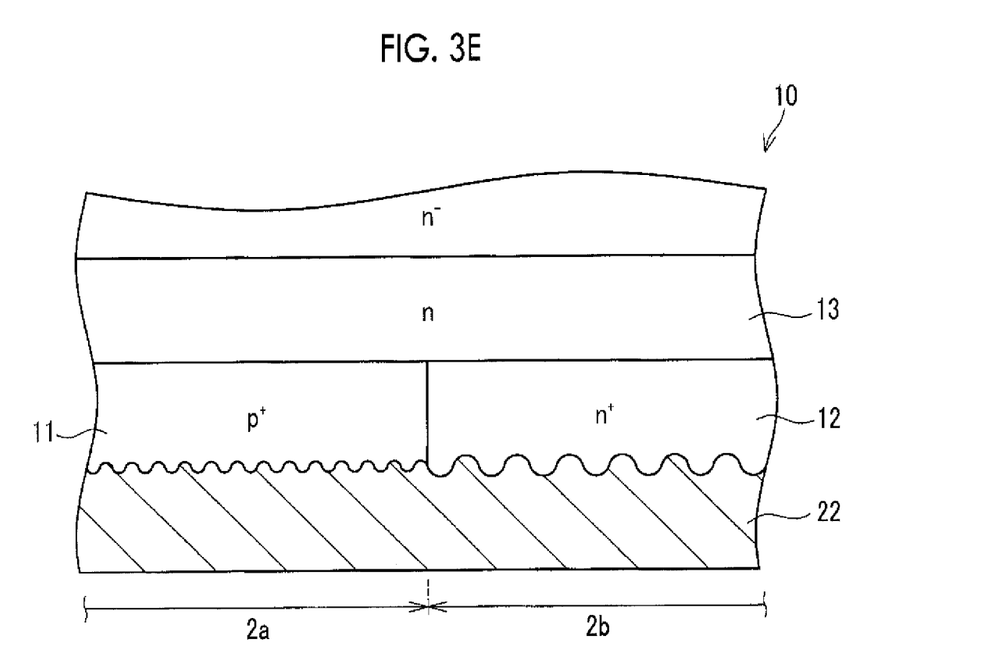
FIG. 3E is an enlarged sectional view schematically showing a main part of the reverse conducting IGBT in the step of forming the rear structure.

Next, as shown in FIG. 3E, the rear electrode 22 is formed on the rear surface of the semiconductor substrate 10 using a sputtering method (S14 of FIG. 2). Since the thickness of the oxide film 42 coated on the rear surface of the semiconductor substrate 10 is extremely small, the rear electrode 22 made of aluminum silicon absorbs or breaks through the oxide film 42, whereby the rear electrode 22 can be into ohmic-contact with each of the collector region 11 and the cathode region 12 exposed on the rear surface of the semiconductor substrate 10. Since the surface roughness of the rear surface of the semiconductor substrate 10 is uniformized by the prior AFM cleaning, the surface roughness of the front surface of the rear electrode 22 coated on the rear surface of the semiconductor substrate 10 is also uniformized. The rear electrode 22 may be formed using a vapor deposition method, instead of the sputtering method.

When the rear electrode 22 is formed using the sputtering method, it is desirable to heat the semiconductor substrate 10, Alternatively, it is desirable to heat the semiconductor substrate 10 after the rear electrode 22 is formed using the sputtering method. The rear electrode 22 can efficiently absorb or break through the oxide film 42 coated on the rear surface of the semiconductor substrate 10 using thermal energy. With this, the rear electrode 22 can be satisfactorily into ohmic contact with each of the collector region 11 and the cathode region 12 exposed on the rear surface of the semiconductor substrate 10. When the rear electrode 22 is formed using the sputtering method, it is desirable to heat the semiconductor substrate 10 to equal to or higher than 50° C. and equal to or lower than 450° C. Alternatively, it is desirable to heat the semiconductor substrate 10 to equal to or higher than 50° C. and equal to or lower than 450° C. after the rear electrode 22 is formed using the sputtering method. If the temperature of the semiconductor substrate 10 is equal to or higher than 50° C., the rear electrode 22 can use sufficient thermal energy and can be satisfactorily into ohmic-contact with each of the collector region 11 and the cathode region 12, If the temperature of the semiconductor substrate 10 is equal to or lower than 450° C., it is possible to suppress deformation of the front electrode 24 formed on the front surface of the semiconductor substrate 10. In a case where the rear electrode 22 is formed using a vapor deposition method instead of the sputtering method, it is desirable to heat the semiconductor substrate 10 after the rear electrode 22 is formed, and it is more desirable to heat the semiconductor substrate 10 to equal to or higher than 50° C. and equal to or lower than 450° C. Similarly, the rear electrode 22 can be satisfactorily into ohmic-contact with each of the collector region 11 and the cathode region 12 using thermal energy.

As described above, the method of manufacturing the reverse conducting IGBT 1 has a feature that, between HF cleaning and the step of forming the rear electrode 22, the surface roughness of the rear surface of the semiconductor substrate 10 is uniformized. The method of manufacturing the reverse conducting IGBT 1 described above has one feature that APM cleaning is performed as a surface roughness uniformizing step. In case, the APM cleaning step is performed, whereby the thin oxide film 42 is coated on the rear surface of the semiconductor substrate 10, it is possible to reduce the surface roughness of the rear surface of the semiconductor substrate 10. With this, variation in surface roughness between the collector region 11 and the cathode region 12 becomes small, and the surface roughness of the rear surface of the semiconductor substrate 10 is uniformized. According to the method of manufacturing the reverse conducting IGBT 1 described above, it is possible to uniformize the surface roughness of the rear surface of the semiconductor substrate 10 merely by adding the APM cleaning step. As a result, the surface roughness of the rear surface of the semiconductor substrate 10 is prevented from being reflected in the rear electrode 22 formed on the rear surface of the semiconductor substrate 10, With this, it is possible to perform appearance inspection for the front surface of the rear electrode 22 with excellent accuracy.

Hereinafter, the features of the technique disclosed in this specification are listed. The matters described below are useful independently.

A method of manufacturing a semiconductor device disclosed in this specification may include a semiconductor region forming step, an HF cleaning step, a surface roughness uniformizing step, and an electrode forming step. In the semiconductor region forming step, a plurality of semiconductor regions with different ion injection amounts are formed so as to be exposed on one principal surface of a semiconductor substrate. A plurality of semiconductor regions with different ion injection amounts also include a semiconductor region where ion injection is not performed. In the HF cleaning step, after the semiconductor region forming step, HF cleaning is performed on one principal surface of the semiconductor substrate. In the surface roughness uniformizing step, after the HF cleaning step, the surface roughness of one principal surface of the semiconductor substrate is uniformized. In the surface roughness uniformizing step, various methods of uniformizing the surface roughness of one principal surface of the semiconductor substrate can be used. For example, as the surface roughness uniformizing step, APM cleaning, polishing, or the like is illustrated. In the electrode forming step, after the surface roughness uniformizing step, electrodes are formed on one principal surface of the semiconductor substrate.

In the surface roughness uniformizing step, APM cleaning may be performed on one principal surface of the semiconductor substrate. If APM cleaning is performed, a thin oxide film is formed on one principal surface of the semiconductor substrate. APM cleaning can make oxygen react with one principal surface of the semiconductor substrate uniformly. For this reason, a recessed portion of the uneven one principal surface of the semiconductor substrate is filled with the oxide film extending from the sides and bottom thereof in a comparatively short period of time. That is, the oxide film which which the recessed portion is filled is formed at a film thickness larger than the apex of a protruded portion of the uneven one principal surface of the semiconductor substrate. With this, if APM cleaning is performed on one principal surface of the semiconductor substrate, the surface roughness of one principal surface of the semiconductor substrate is reduced by the oxide film, and the surface roughness is uniformized. Since the thickness of the oxide film formed through APM cleaning is small, the electrodes formed on one principal surface of the semiconductor substrate absorb and break through the oxide film and can be thus electrically connected to one principal surface of the semiconductor substrate.

In the electrode forming step, a sputtering method or a vapor deposition method may be used. If the sputtering method is used, the electrodes can efficiently absorb or break through the oxide film coated on one principal surface of the semiconductor substrate using thermal energy of plasma. With this, satisfactory electrical connection is provided between the electrodes and one principal surface of the semiconductor substrate. In a case where the vapor deposition method is used, it is desirable to heat the semiconductor substrate after the electrodes are formed. The electrodes can efficiently absorb or break through the oxide film coated on one principal surface of the semiconductor substrate using thermal energy. With this, satisfactory electrical connection is provided between the electrodes and one principal surface of the semiconductor substrate.

In the electrode forming step, the electrodes can be formed on one principal surface of the semiconductor substrate using a sputtering method while heating the semiconductor substrate. The sputtering method is performed while heating the semiconductor substrate, whereby the electrodes can efficiently absorb or break through the oxide film coated on one principal surface of the semiconductor substrate using thermal energy. With this, satisfactory electrical connection is provided between the electrodes and one principal surface of the semiconductor substrate.

In the electrode forming step, the electrodes may be formed on one principal surface of the semiconductor substrate using a sputtering method while adjusting the temperature of the semiconductor substrate to equal to or higher than 50° C. and equal to or lower than 450° C. If the semiconductor substrate is adjusted within this temperature range, the electrodes are satisfactorily electrically connected to one principal surface of the semiconductor substrate, and it is possible to suppress deformation of the electrodes formed on the other principal surface of the semiconductor substrate.

While specific examples of the present disclosure have been described in detail, these examples are for illustrative purposes and are not intended to limit the present disclosure. The present disclosure includes various modifications and alterations of the specific examples illustrated above. The technical elements described in this specification or the drawings exert technical utility independently or in combination of some of them, and the combination is not limited to one described in the claims as filed. The technology illustrated in this specification or the drawings achieves a plurality of objects at the same time, and has technical utility by achieving one of these objects.

What is claimed is:

1. A method of manufacturing a semiconductor device, the method comprising:
    forming semiconductor regions such that a plurality of semiconductor regions with different ion injection amounts are exposed on one principal surface of a semiconductor substrate, as a semiconductor region forming process;
    after the semiconductor region forming process, performing a cleaning using hydrofluoric acid on the one principal surface of the semiconductor substrate, as a cleaning process;
    after the cleaning process, uniformizing the surface roughness of the one principal surface of the semiconductor substrate, as a surface roughness uniformizing process; and
    after the surface roughness uniformizing process, forming electrodes on the one principal surface of the semiconductor substrate, as an electrode forming process.

2. The method of manufacturing a semiconductor device according to claim 1,
    wherein, in the surface roughness uniformizing process, the one principal surface of the semiconductor substrate is cleaned by a cleaning using a mixture of ammonia and a hydrogen peroxide solution.

3. The method of manufacturing a semiconductor device according to claim 2,
wherein, in the electrode forming process, the electrodes are formed using a sputtering method.

4. The method of manufacturing a semiconductor device according to claim 2,
wherein, in the electrode forming process, the electrodes are formed using a vapor deposition method.

5. The method of manufacturing a semiconductor device according to claim 3,
wherein, in the electrode forming process, the electrodes are formed using the sputtering method while heating the semiconductor substrate.

6. The method of manufacturing a semiconductor device according to claim 5,
wherein, in the electrode forming process, the electrodes are formed using the sputtering method while heating the semiconductor substrate to equal to or higher than 50° C. and equal to or lower than 450° C.

* * * * *